US009281067B1

(12) United States Patent
Lee et al.

(10) Patent No.: US 9,281,067 B1
(45) Date of Patent: Mar. 8, 2016

(54) SEMICONDUCTOR TEST SYSTEM AND OPERATION METHOD OF THE SAME (71) Applicant: Samsung Electronics Co., Ltd., Suwon-Si, Gyeonggi-Do (KR)

(72) Inventors: Hong Gab Lee, Hwaseong-si (KR); Mansik Choi, Hwaseong-si (KR); Byoungwoo Ye, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 6 days.

(21) Appl. No.: 14/456,600

(22) Filed: Aug. 11, 2014

(51) Int. Cl.
*G11C 16/10* (2006.01)
*G11C 29/00* (2006.01)

(52) U.S. Cl.
CPC ............... G11C 16/10 (2013.01); G11C 29/00 (2013.01)

(58) Field of Classification Search
CPC .......... G06F 11/27; G06F 11/20; G11C 16/10
USPC ................. 365/222, 185, 185.1; 714/6.21, 30
See application file for complete search history.

(56) References Cited

U.S. PATENT DOCUMENTS

| | | | |
|---|---|---|---|
| 7,010,632 B2 * | 3/2006 | Floman ........................ 710/104 |
| 8,143,694 B2 | 3/2012 | Choserot et al. |
| 8,223,575 B2 | 7/2012 | Lin et al. |
| 8,400,860 B2 | 3/2013 | Lin et al. |
| 8,471,623 B2 | 6/2013 | Xiong et al. |
| 8,520,434 B2 | 8/2013 | Kang et al. |
| 8,665,626 B2 | 3/2014 | Yazawa et al. |
| 2008/0217734 A1 | 9/2008 | Lin et al. |
| 2009/0132736 A1* | 5/2009 | Hasan et al. ..................... 710/56 |
| 2009/0294900 A1 | 12/2009 | Choserot et al. |
| 2011/0164451 A1 | 7/2011 | Kim et al. |
| 2011/0261495 A1 | 10/2011 | Pracht et al. |
| 2011/0286278 A1 | 11/2011 | Kang et al. |
| 2011/0316615 A1 | 12/2011 | Xiong et al. |
| 2012/0020177 A1 | 1/2012 | Lin et al. |
| 2012/0069690 A1 | 3/2012 | Yazawa et al. |
| 2012/0161855 A1 | 6/2012 | Moy et al. |
| 2013/0227344 A1* | 8/2013 | Sohn et al. ................... 714/6.21 |
| 2014/0328127 A1* | 11/2014 | Tai et al. .................. 365/185.12 |
| 2015/0095547 A1* | 4/2015 | Bains et al. ....................... 711/5 |
| 2015/0103597 A1* | 4/2015 | Park et al. ................ 365/185.03 |

FOREIGN PATENT DOCUMENTS

KR 20080111329 A 12/2008

* cited by examiner

*Primary Examiner* — Hoai V Ho
*Assistant Examiner* — Muna A Techane
(74) *Attorney, Agent, or Firm* — Harness, Dickey & Pierce, P.L.C.

(57) ABSTRACT

A semiconductor test system includes a nonvolatile memory and a test device. The nonvolatile memory is configured to include an information region. The test device is configured to include a pin memory and a pin memory controller. The pin memory controller is configured to separate information data into a plurality of information data groups, sequentially transmit the separated plurality of information data groups to the pin memory, sequentially transmit the transmitted plurality of information data group in the pin memory to the nonvolatile memory, and program the transmitted plurality of information data group in the nonvolatile memory into the information region.

12 Claims, 9 Drawing Sheets

SEMICONDUCTOR TEST SYSTEM AND OPERATION METHOD OF THE SAME

BACKGROUND

1. Technical Field

At least some example embodiments of the inventive concepts relate generally to semiconductor test system and operation method.

2. Discussion of the Related Art

Semiconductor memory devices may be divided into volatile memory devices and non-volatile memory devices. The non-volatile memory device may maintain the stored data when power is off. A non-volatile memory device may include an electrically erasable and programmable ROM (EEPROM). A memory cell may include floating gate transistor. The memory cell may store data by controlling threshold voltage of the floating gate transistor.

The non-volatile memory device may store information data such as trimming information controlling a level of direct current voltage or repair information of defect cell. The information data for operation of the non-volatile memory is programmed in a test operation. However, when a size of the memory in the test device is smaller than a size of information data to store, there may be a problem programming the information data.

SUMMARY

According to at least one example embodiment, a semiconductor test system includes a nonvolatile memory configured to include an information region, and a test device configured to include a pin memory and a pin memory controller, wherein the pin memory controller is configured to separate an information data into a plurality of information data groups, sequentially transmit the separated plurality of information data groups to the pin memory, sequentially transmit the transmitted plurality of information data group in the pin memory to the nonvolatile memory, and program the transmitted plurality of information data group into the nonvolatile memory into the information region.

The information region is configured to store a single bit data. The nonvolatile memory is configured to include 3-dimensional memory cell array. When a size of the information data of the nonvolatile memory is bigger than a size of the pin memory, the pin memory controller separates the information data. The nonvolatile memory is configured to program simultaneously the plurality of the data group.

The plurality of information data groups include a first and a second information data groups, the pin memory controller is configured to transmit a program set up command to the nonvolatile memory, and transmit the first information data group to the pin memory, the pin memory controller is configured to transmit a data input command to the nonvolatile memory, and transmit the second information data group to the pin memory. The pin memory controller is configured to transmit a program confirm command to the nonvolatile memory, the nonvolatile memory is configured to program the first and the second information data groups according to the transmitted program confirm command.

In another example embodiment, a method of a semiconductor test system operating, the semiconductor test system comprises a nonvolatile memory including an information region, and a test device including a pin memory and a pin memory controller, the method comprising, generating a plurality of divided information data sets, sequentially transmitting each of the plurality of divided information data sets to the pin memory, transmitting each of the divided information data sets from the pin memory to the nonvolatile memory; and if all of the information data is transmitted to the nonvolatile memory, programming the information data into the information region.

The programming is to program the information data to the information region with single bit data. The nonvolatile memory includes 3-dimensional memory cell array. If a size of the information data is bigger than a size of the pin memory, the generating is performed. The programming is to program simultaneously the divided data sets into the information region.

The divided information data sets includes a first and a second information data set, transmitting the plurality of divided information data sets to the nonvolatile memory comprising transmitting the first information data set to the nonvolatile memory after transmitting a program set up command to the nonvolatile memory; and transmitting the second information data set to the nonvolatile memory after transmitting a data input command to the nonvolatile memory. The programming comprising transmitting a program confirm command to the nonvolatile memory, and programming the first and the second information data sets into the information region.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Detailed example embodiments of the inventive concepts are disclosed herein. However, specific structural and functional details disclosed herein are merely representative for purposes of describing example embodiments. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
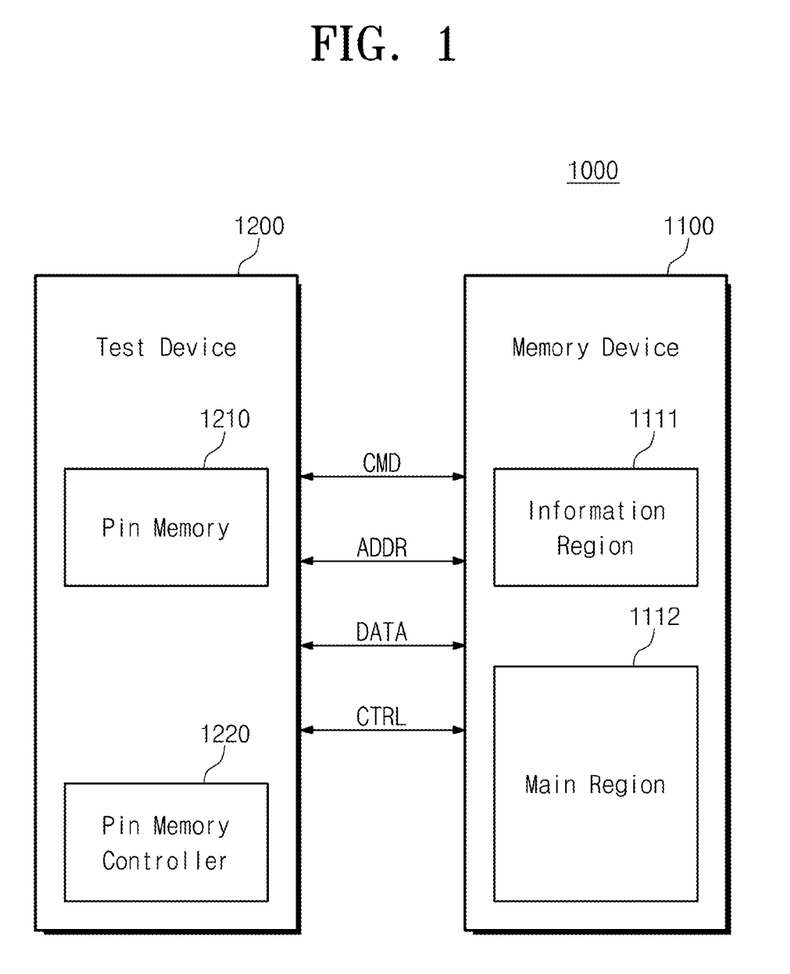
FIG. 1 is a block diagram illustrating a semiconductor test system according to at least one example embodiment of the inventive concepts.

FIG. 1 is a block diagram illustrating a semiconductor test system according to at least one example embodiment of the inventive concepts. Referring to FIG. 1, the semiconductor test system (1000) comprises a memory device (1100) and a test device (1200).

The memory device (1100) is controlled by the test device (1200) and performs operations (for example, a read or write operation etc.) corresponding to requests of the test device (1200). The memory device (1100) may include an information region (1111) and main region (1112). The memory device (1100) may include a plurality of memory blocks.

The information region (1111) may include single level cell which can stores 1-bit data per cell. The main region (1112) may include multi level cell storing N-bit data (N is 2 or larger integer) per cell. Furthermore, each of the information and main region (1111, 1112) may include multi level cell. In some example embodiments, the multi level cell of the information region (1111) may perform LSB (least significant bit) program operation to operate like a single level cell.

The information region (1111) may store information data such as repair information of defect cell or trimming information for controlling a level of direct control voltage. The information data may be programmed to the information region (1111) in a test operation. The main region (1112) may store host data received from outside by a write request of a host (not shown).

The test device (1200) may control operations of the memory device (1100) and program the information data to the memory device (1100). The test device (1200) may include a pin memory (1210) and a pin memory controller (1220).

The pin memory (1210) is a memory assigned to each input/output. The test device (1200) may store different information data to each input/output pin of the memory device (1100). The pin memory controller (1220) may program the information data stored in the pin memory to the information region (1111) of the memory device (1100).

The pin memory controller (1220) may divide the information data into a plurality of information data groups. The pin memory controller (1220) may sequentially transmit the divided information data groups to the pin memory (1210). The pin memory controller (1220) may sequentially transmit the plurality of information data groups from the pin memory to the memory device (1100). The pin memory controller (1220) may program the transmitted plurality of information data groups of the memory device (1100) to the information region (1111).

Figure 2:
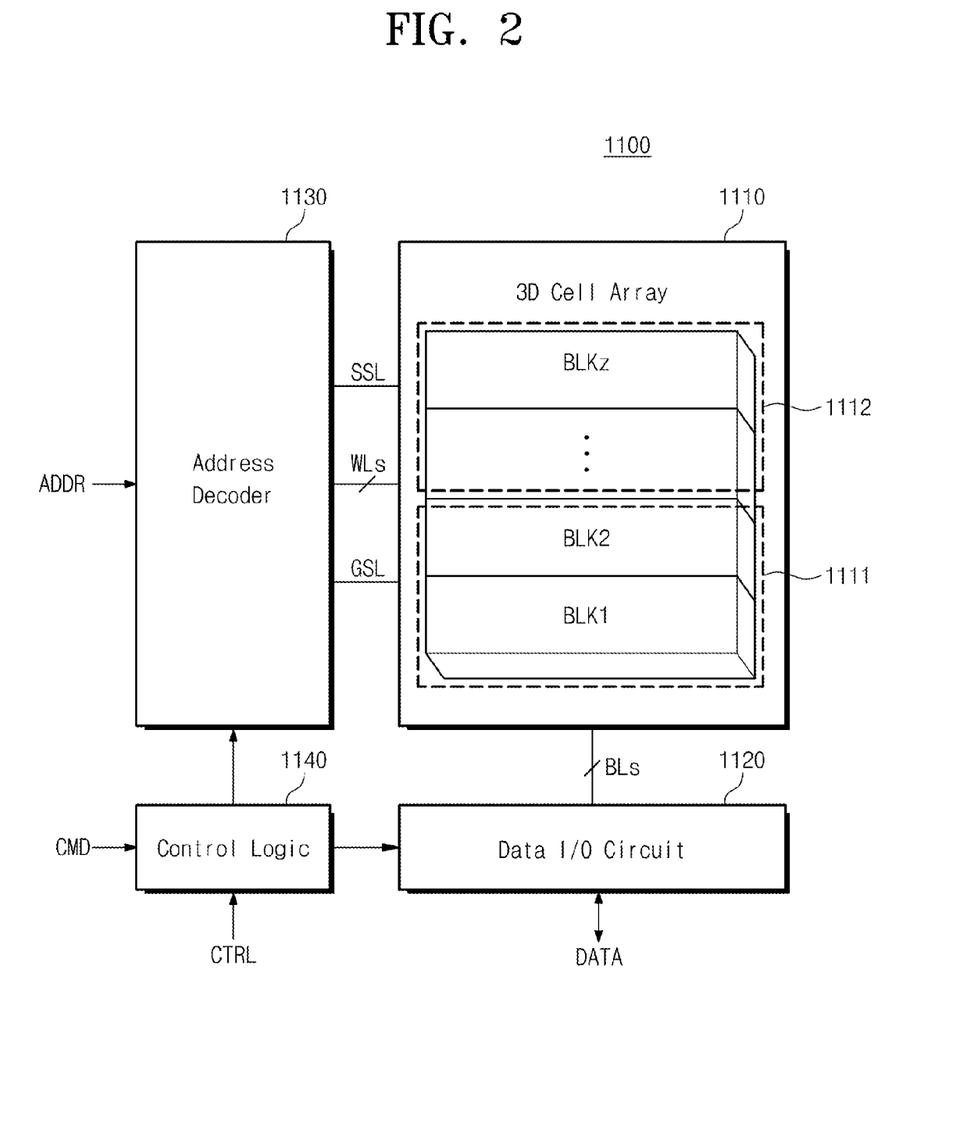
FIG. 2 is a block diagram further illustrating in one example the memory device of FIG. 1

FIG. 2 is a block diagram further illustrating in one example the memory device of FIG. 1. Referring to FIG. 2, the memory device (1100) may include a three-dimensional (3D) cell array (1110), a data input/output circuit (1120), an address decoder (1130) and/or control logic (1140).

The 3D cell array (1110) may include the information region (1111) and the main region (1112). The 3D cell array (1110) may include a plurality of memory blocks BLK1 to BLKz, each of which is formed to have a three-dimensional structure (or, a vertical structure). Each of the information and main regions (1111, 1112) may include a plurality of memory blocks. For a memory block having a two-dimensional (horizontal) structure, memory cells may be formed in a direction horizontal to a substrate. For a memory block having a three-dimensional structure, memory cells may be formed in a direction perpendicular to the substrate. Each memory block may be an erase unit of the memory device (1100).

The data input/output circuit (1120) may be connected with the 3D cell array (1110) via a plurality of bit lines. The data input/output circuit (1120) may receive data from an external device or output data read from the 3D cell array (1110) to the external device. The address decoder (1130) may be connected with the 3D cell array (1110) via a plurality of word lines and selection lines GSL and SSL. The address decoder (1130) may select the word lines in response to an address ADDR.

The control logic (1140) may control programming, erasing, and/or reading, etc. of the memory device (1100). For example, at programming, the control logic (1140) may control the address decoder (1130) such that a program voltage is supplied to a selected word line, and may control the data input/output circuit (1120) such that data is programmed.

Figure 3:
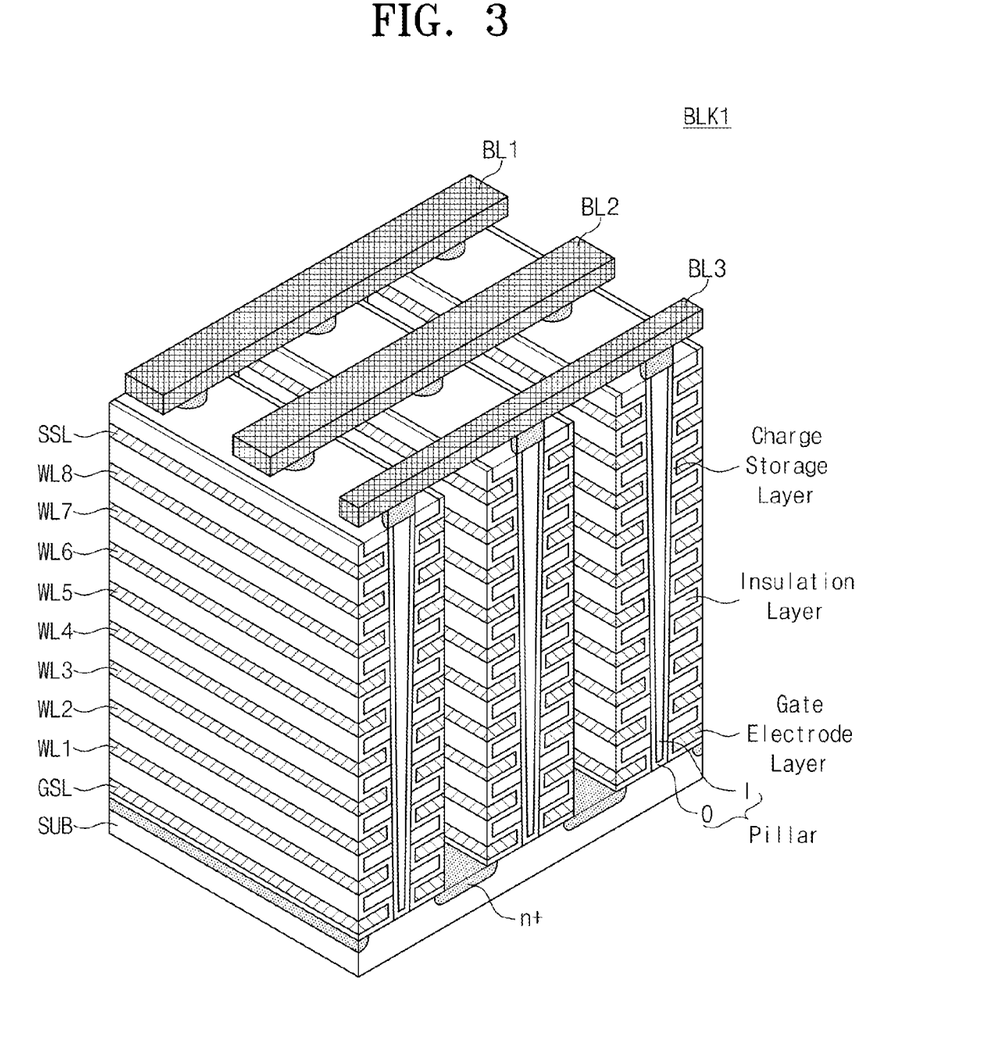
FIG. 3 is an example perspective view schematically illustrating a 3D structure of a memory block illustrated in FIG. 2.

FIG. 3 is a perspective view schematically illustrating a 3D structure of a memory block illustrated in FIG. 2. Referring to FIG. 3, a memory block (BLK1) may be formed in a direction perpendicular to a substrate (SUB). An n+ doping region may be formed at the substrate (SUB). A gate electrode layer and an insulation layer may be deposited on the substrate (SUB) in turn. A charge storage layer may be formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion (O) of the pillar may be formed of a channel semiconductor, and an inner portion (I) thereof may be formed of an insulation material such as silicon oxide.

The gate electrode layer of the memory block BLK1 may be connected with a ground selection line GSL, a plurality of word lines WL1 to WL8, and a string selection line SSL. The pillar of the memory block BLK1 may be connected with a plurality of bit lines BL1 to BL3. In FIG. 3, there is illustrated an example where one memory block BLK1 has two selection lines SSL and GSL and eight word lines WL1 to WL8. However, example embodiments of the inventive concepts are not limited thereto.

Figure 4:
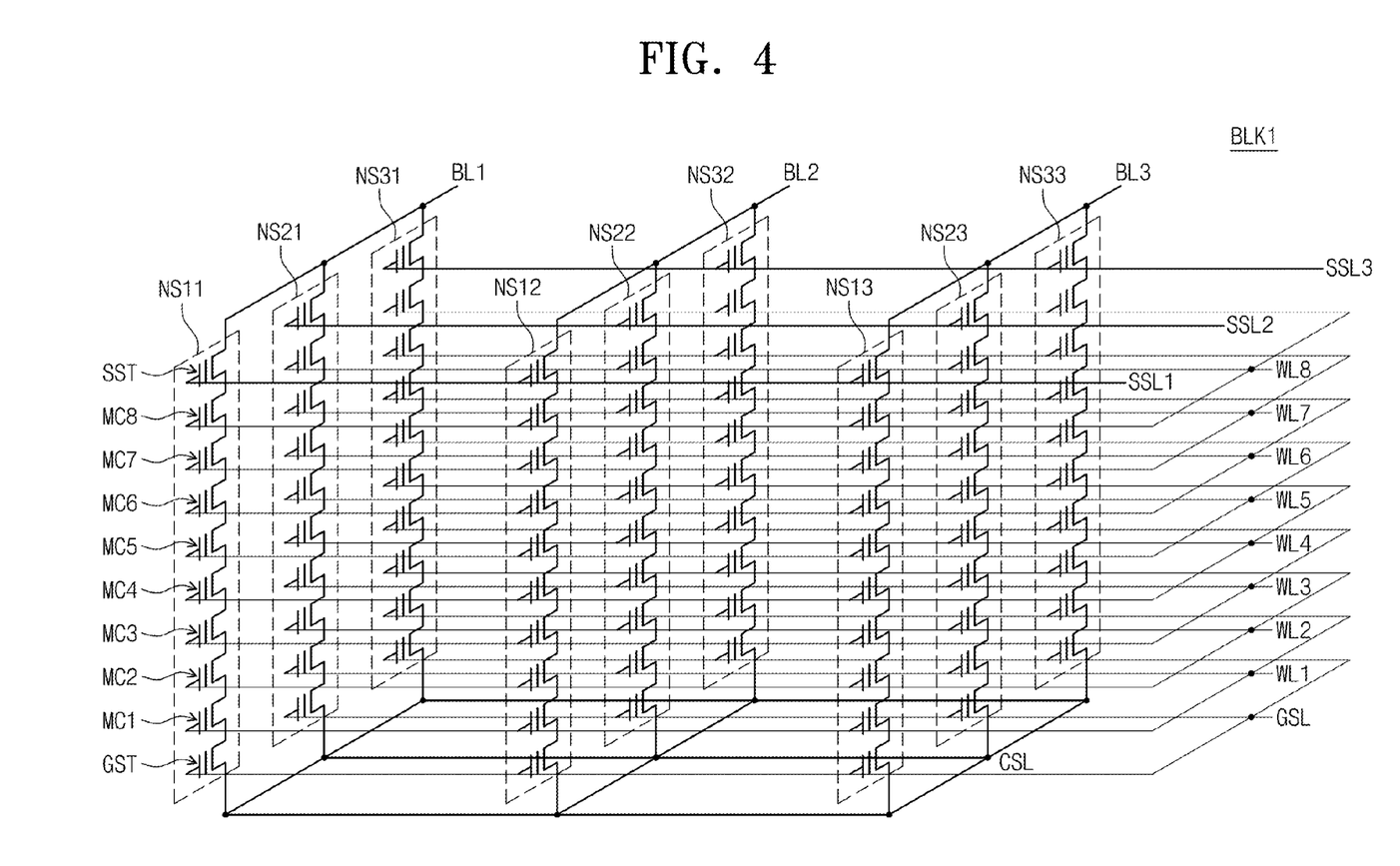
FIG. 4 is an example equivalent circuit diagram for the memory block illustrated in FIG. 3.

FIG. 4 is an equivalent circuit diagram for the memory block illustrated in FIG. 3. Referring FIG. 4, NAND strings NS11 to NS33 may be connected between bit lines BL1 to BL3 and a common source line CLS. Each NAND string (e.g., NS11) may include a string selection transistor SST, a plurality of memory cells MC1 to MC8, and/or a ground selection transistor GST.

The string selection transistor SST may be connected with string selection lines SSL1 to SSL3. The memory cells MC1 to MC8 may be connected with corresponding word lines WL1 to WL8, respectively. The ground selection transistor GST may be connected with ground selection lines GSL. A string selection transistor SST may be connected with a bit lines, and a ground selection transistor GST may be connected with a common source line CLS.

Word lines (e.g., WL1) having the same height may be connected in common, and the ground selection lines GSL1 to GSL3 and the string selection lines SSL1 to SSL3 may be separated from one another. At programming of memory cells (constituting a page) connected with a first word line WL1 and included in NAND strings NS11, NS12, and NS13, a first word line WL1, a first string selection line SSL1, and a first ground selection line may be selected.

Figure 5:
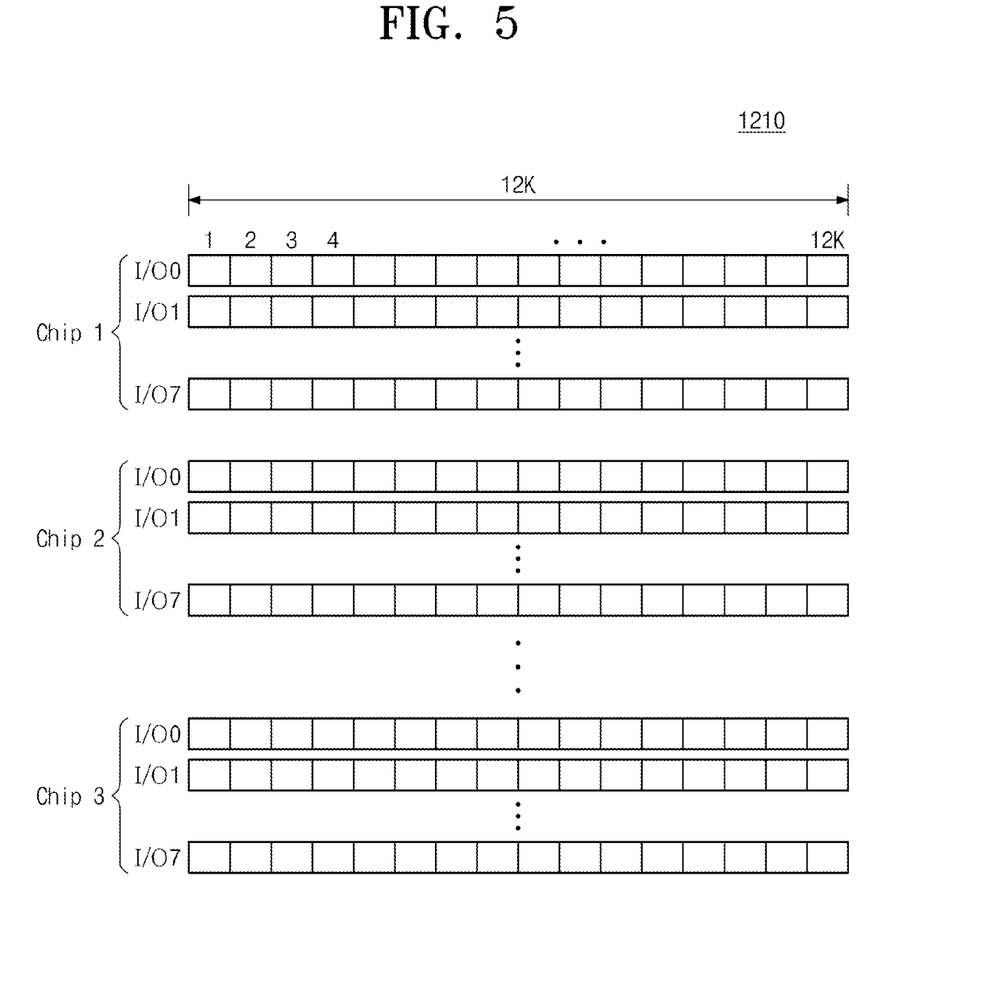
FIG. 5 is a diagram illustrating the pin memory of FIG. 1 according to some example embodiments of inventive concepts.

FIG. 5 is a diagram illustrating the pin memory of FIG. 1 according to example embodiments of inventive concepts. The test device (1200, in FIG. 1) may use the pin memory (1210) to program information data stored differently to each of a plurality of memory devices.

Referring to the FIG. 5, the pin memory (1210) may assign a part of the pin memory of predetermined (or desired) size to each of the input/output pins of the plurality of memory devices. For example, a size of the pin memory assigned to each of the input/output pins may be 12 KB (kilo byte). The pin memory assigned to each of the input/output pins is capable of storing different information data. The pin memory (1210) may transmit the stored information data to the assigned input/output pin.

Figure 6:
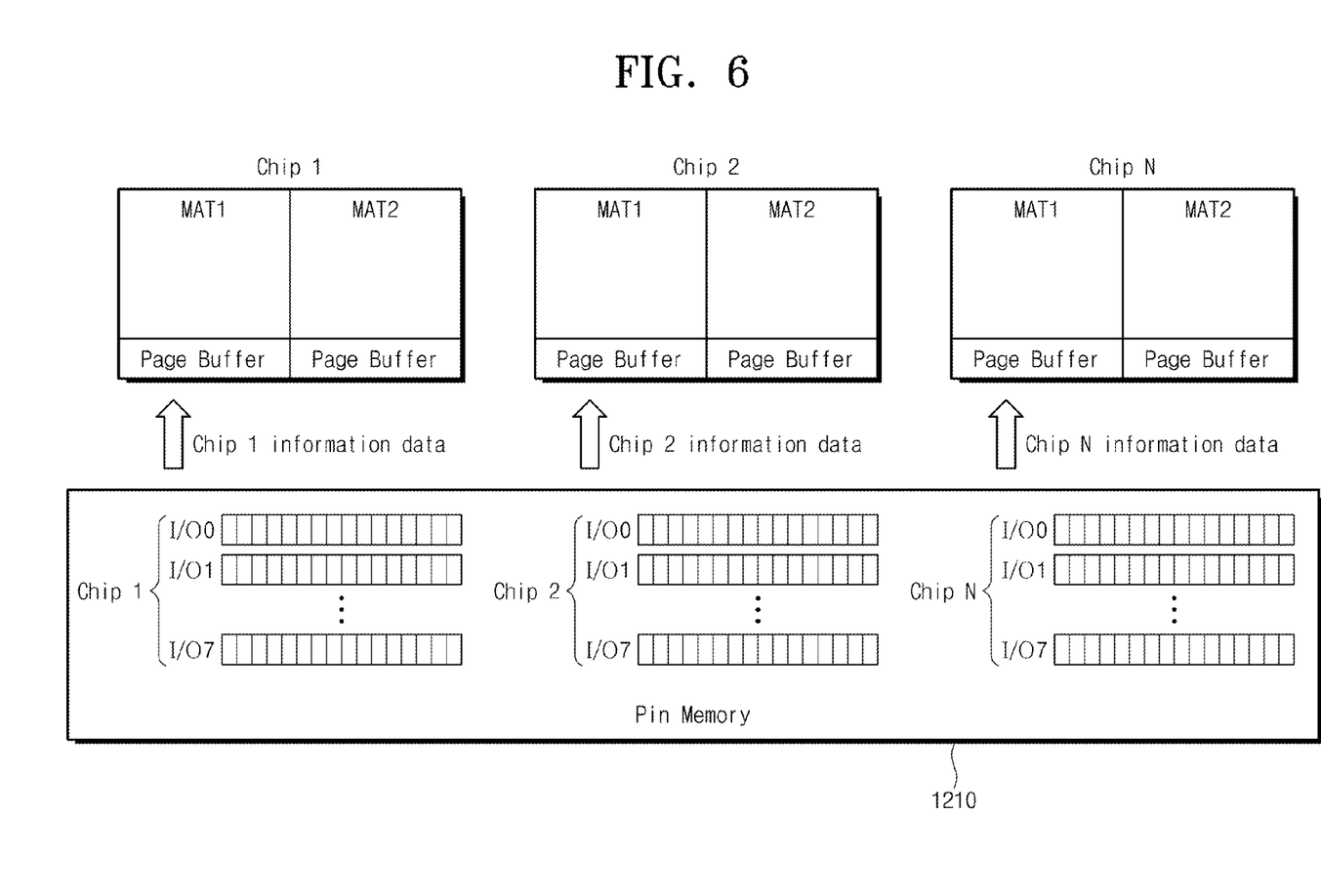
FIG. 6 is an example diagram illustrating an operation of the pin memory in FIG. 5.

FIG. 6 is a diagram illustrating an operation of the pin memory in FIG. 5. Referring to FIG. 6, the pin memory (1210) may load the stored information data to page buffer of memory device. The pin memory (1210) may simultaneously load information data assigned to each of the memory devices to the plurality of memory devices. The test device (1200) may reduce test time to load information data and programs simultaneously to the plurality of memory devices.

Figure 7:
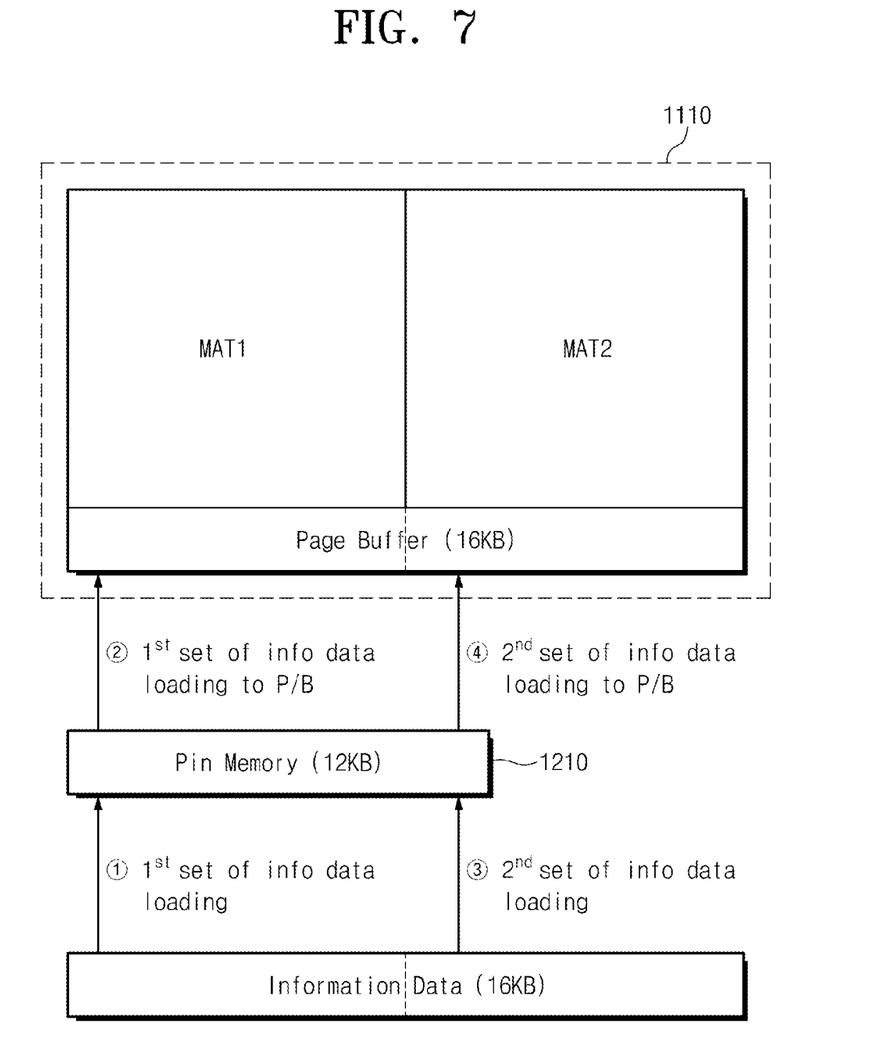
FIG. 7 is an example diagram illustrating an operation of the pin memory controller of FIG. 1.

FIG. 7 is a diagram illustrating an operation of the pin memory controller of FIG. 1. The cell array of memory device may include two mats (MAT1, MAT2). The mat may include a plurality of memory blocks. For improving test performance, the information data is programmed simultaneously to at least two blocks of memory device (1100). For example, if the memory device includes 2 mats (MAT1, MAT2), the first memory block of the first mat (MAT1) and the second memory block of the second mat (MAT2) may be programmed simultaneously. Each mat may be connected with page buffer having a size of program page.

Because of high integration of the memory device (1100) in FIG. 1, the capacity of page buffer increases gradually. As the size of the page buffer of the memory device increases, changing or increasing the pin memory increases cost. According to the test device, changing the size of the pin memory is impossible. Referring to FIG. 7, for example, a size of page buffer of the memory device is 16 KB, and a size of the pin memory is 12 KB. Like this example that the size of page buffer is bigger than the size of the pin memory, the pin memory is not capable of storing information data loading to the page buffer at once.

The pin memory controller (1220) divides the 16 KB information data of the test device into 8 KB first information data set and 8 KB the second information set. The pin memory controller (1220) loads the 8 KB first information data set to the pin memory (1210) (①). Since then, the pin memory controller (1220) transmits the first information data set loaded to the pin memory to the first mat (MAT1) of the memory device (1100)(②).

The pin memory controller (1220) transmits the second information data set to the pin memory (1210)(③). Since then, the pin memory controller (1220) transmits the second information data set loaded to the pin memory to the page buffer of the second mat (MAT2)(④). The pin memory controller (1220) programs the first and second information data set loaded to the page buffer into the information region.

Referring to FIG. 7, the pin memory controller (1220) may divide the information data into a plurality of sets or groups. The pin memory controller (1220) may transmit sequentially the divided plurality of information set to the pin memory (1210). The pin memory controller (1220) may transmit sequentially the information data sets of the pin memory to the memory device (1100). The pin memory controller (1220) may program the transmitted plurality of information data sets to the information region (1111).

Figure 8:
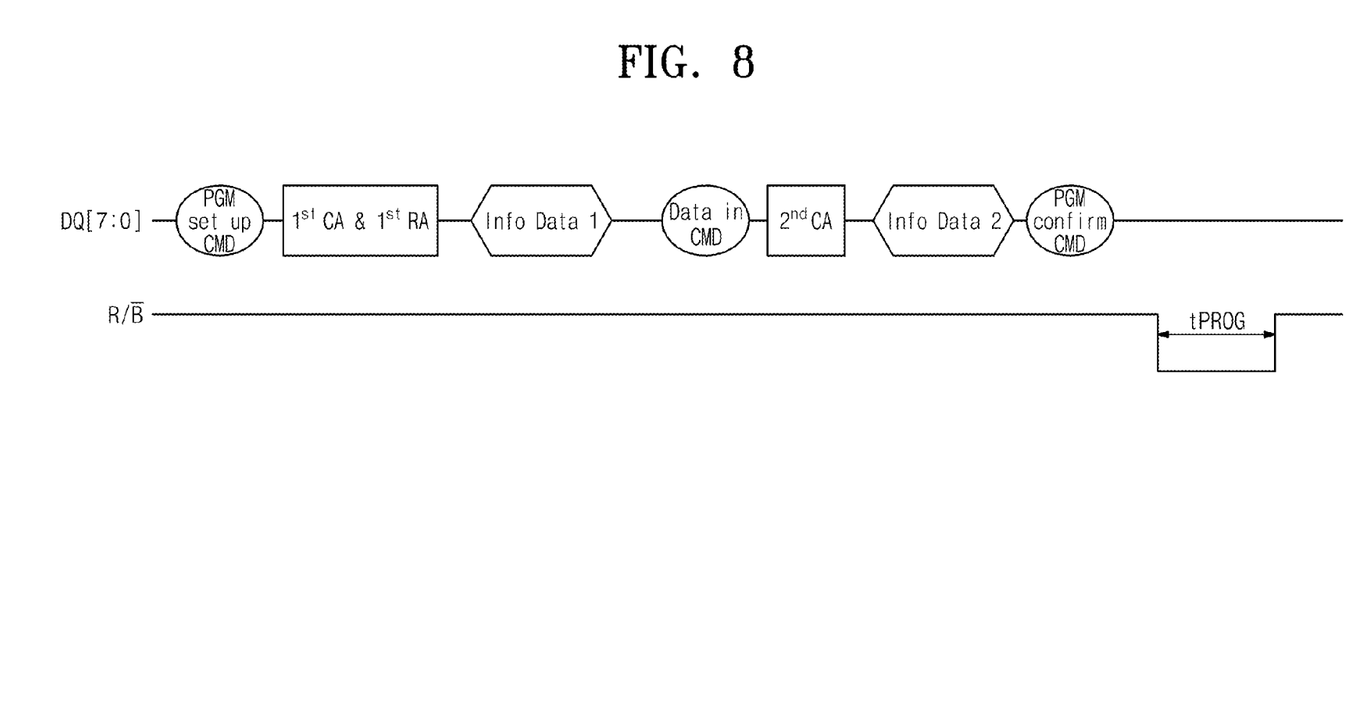
FIG. 8 is an example timing diagram illustrating an operation of the pin memory controller in FIG. 7.

FIG. 8 is a timing diagram illustrating an operation of the pin memory controller in FIG. 7. Referring to FIG. 8, the pin memory controller (1220) transmits a program set up command to the memory device (1100). The pin memory controller (1220) transmits the first column address and the first row address ($1^{st}$ CA & $1^{st}$ RA) of the information region to store the information data to the memory device (1100).

Since then, the pin memory controller (1220) transmits information data. If the size of the information data is bigger than the size of the pin memory (1210), the pin memory controller (1220) generates divided plurality of information data set using the information data. The pin memory controller (1220) may transmit the generated first information data set to the memory device (1100).

The pin memory controller (1220) may transmit a data input command to the memory device (1100). After received the program set up command, if the memory device receives the data input command, the memory device (1100) may prepare for receiving the second information data set. The pin memory controller (1220) may transmit the second column address to the memory device (1100). The second row address is not necessary because the memory device (1100) programs identical WL location of the first and the second mat.

The pin memory controller (1220) may transmit the second information data set to the memory device (1100). Since then, the pin memory controller (1220) may transmit a program confirm command to the memory device (1100). The memory device (1100) may program the information data stored at page buffer to the information region corresponding to the received address. A ready/busy signal is low state when memory device (1100) performs programming. When the programming is completed, the ready/busy signal is high state.

Figure 9:
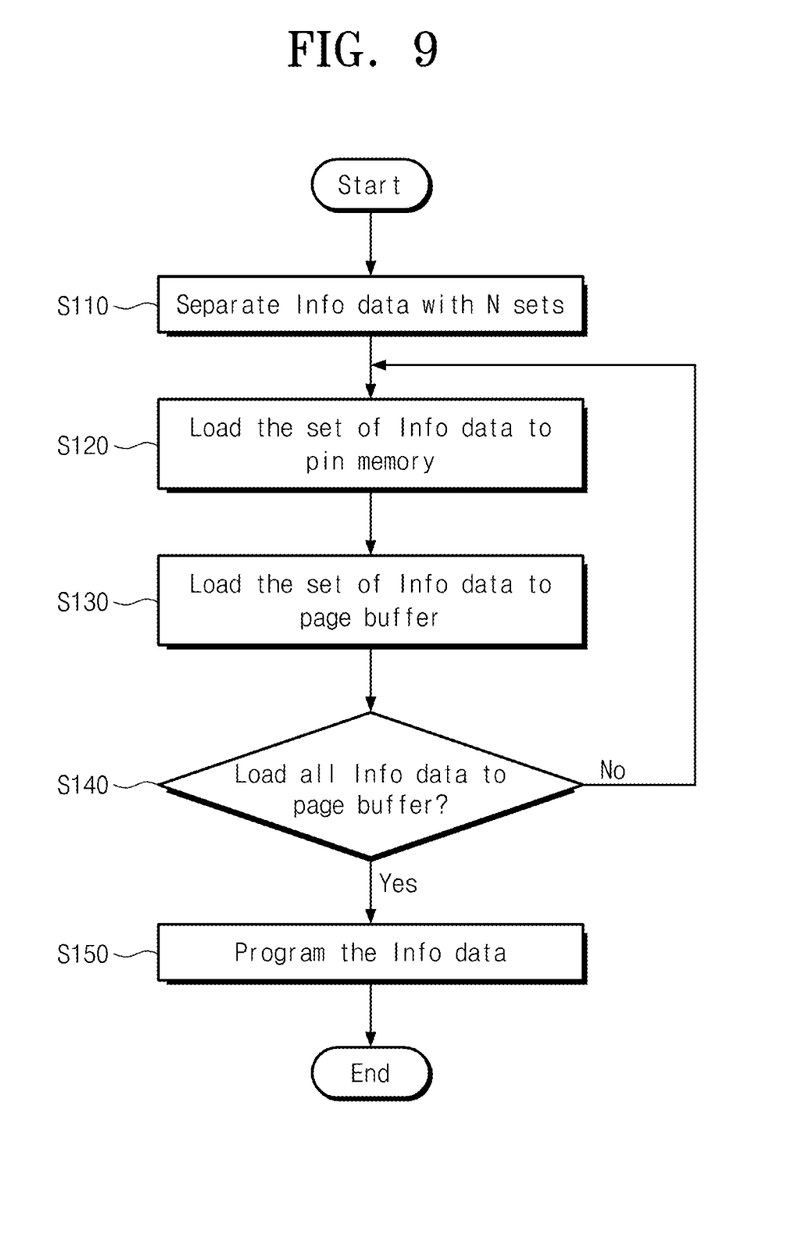
FIG. 9 is an example flow chart illustrating an operation of the pin memory controller in FIG. 7.

FIG. 9 is a flow chart illustrating an operation of the pin memory controller in FIG. 7. Referring to FIG. 9, the pin memory controller (1220) divides the information data into N (N is 2 or more integer) information data sets (S110). The pin memory controller (1220) loads at least one of the information data set to the pin memory (S120). The pin memory controller (1220) loads the information data sets loaded at the pin memory to the page buffer (S130).

The pin memory controller (1220) determines whether all of information data sets are loaded to the page buffer (S140). If all of the information data sets are not loaded to the pin memory, the pin memory controller (1220) performs S120. If all information data sets are loaded to the page buffer, the pin memory controller (1220) programs the information data to the information region (S150).

The foregoing is illustrative of example embodiments and is not to be construed as limiting thereof. Although a few example embodiments have been described, those skilled in the art will readily appreciate that many modifications are possible in example embodiments of the inventive concepts without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments of the inventive concepts and is not to be construed as limited to the specific example embodiments disclosed, and that modifications to the disclosed example embodiments, as well as other example embodiments, are intended to be included within the scope of the appended claims.

What is claimed is:

1. A semiconductor test system comprising:
a nonvolatile memory configured to include an information region; and
a test device configured to include a pin memory and a pin memory controller,
wherein the pin memory controller is configured to divide information data into a plurality of information data groups if a size of the information data is bigger than a size of the pin memory, sequentially transmit the divided plurality of information data groups to the pin memory, sequentially transmit the plurality of information data groups of the pin memory to the nonvolatile memory, and program the plurality of information data groups of the nonvolatile memory into the information region.

2. The semiconductor test system of claim 1, wherein the information region is configured to store single bit data.

3. The semiconductor test system of claim 1, wherein the nonvolatile memory includes a 3-dimensional memory cell array.

4. The semiconductor test system of claim 1, wherein the nonvolatile memory is configured to simultaneously program the plurality of the information data groups.

5. The semiconductor test system of claim 4, wherein
the plurality of information data groups include first and second information data groups,
the pin memory controller is configured to transmit a program set up command to the nonvolatile memory, and transmit the first information data group to the pin memory, and
the pin memory controller is configured to transmit a data input command to the nonvolatile memory, and transmit the second information data group to the pin memory.

6. The semiconductor test system of claim 5, wherein
the pin memory controller is configured to transmit a program confirm command to the nonvolatile memory,
the nonvolatile memory is configured to program the first and the second information data groups according to the program confirm command.

7. A method of operating a semiconductor test system including:
a nonvolatile memory including an information region and a test device including a pin memory and a pin memory controller, the method comprising,
generating a plurality of information data sets based on information data if a size of the information data is bigger than a size of the pin memory;
sequentially transmitting each of the plurality of information data sets to the pin memory;
transmitting each of the information data sets from the pin memory to the nonvolatile memory; and
if all of the information data sets are transmitted to the nonvolatile memory, programming the plurality of information data sets into the information region.

8. The method of claim 7, wherein the programming programs the plurality of information data sets with single bit data.

9. The method of claim 7, wherein the nonvolatile memory includes 3-dimensional memory cell array.

10. The method of claim 7, wherein the programming is to program simultaneously the plurality of information data sets into the information region.

11. The method of claim 10, wherein the plurality of information data sets includes a first and a second information data set, the transmitting each of information data sets from the pin memory to the nonvolatile memory further comprising:
transmitting the first information data set to the nonvolatile memory after transmitting a program set up command to the nonvolatile memory; and
transmitting the second information data set to the nonvolatile memory after transmitting a data input command to the nonvolatile memory.

12. The method of claim 11, wherein the programming includes:
transmitting a program confirm command to the nonvolatile memory; and
simultaneously programming the first and the second information data sets into the information region.

* * * * *